United States Patent Office 3,181,981
Patented May 4, 1965

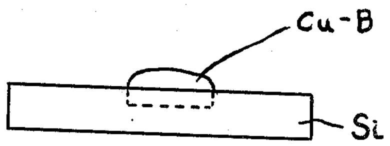
INVENTORS
A.H. Benny
A. Trainor
BY Frank R. Trifari
AGENT

3,181,981
SEMI-CONDUCTOR DEVICE WITH COPPER-BORON ALLOYED ELECTRODE AND METHOD OF MAKING THE SAME

Alan Hugh Berger Benny and Albert Trainor, Southampton, England, assignors to North American Philips Company, Inc., New York, N.Y Filed Oct. 30, 1961, Ser. No. 148,565
Claims priority, application Great Britain, Nov. 1, 1960, 37,513/60
5 Claims. (Cl. 148—185)

The present invention relates to semi-conductor devices.

It is often desirable in the manufacture of semi-conductor devices to provide a zone which is highly doped, that is, a zone which has a high content of significant impurity determining the conductivity type and conductivity of the zone.

As an example, a problem in the design of power transistors is to obtain high factor $\alpha'$ at high currents. This can be achieved in practice by using complex geometries for the emitter and collector (for example several emitters may be provided to allow a high total emitter current with a relatively low current through each individual emitter) but the ultimate limiting parameter is the emitter efficiency. The effect of emitter efficiency on the amplification factor $$\alpha\left(\alpha'=\frac{\alpha}{1-\alpha}\right)$$

is given by the identity $\alpha=\beta\gamma$ where $\beta$ is a constant dependent on the base width and the lifetime of minority carriers in the base and $\gamma$ is the emitter efficiency. By selection of material and good design of the transistor, $\beta$ may be made almost equal to unity. Thus the amplification factor $\alpha$ can be made dependent substantially only on $\gamma$.

For high currents, a p-type emitter and $\alpha'>10$, $\gamma$ is determined by the expression:

$$\gamma=1-\frac{W^2 I_e}{eAL_eD_eP_e}$$

where

W is the base width,
$I_e$ is the emitter current,
$e$ is the electronic charge,
A is the emitter area,
$L_e$ is the diffusion length in the emitter zone,
$D_e$ is the diffusion coefficient, and
$P_e$ is the hole concentration in the emitter zone.

Thus if the geometry is constant, $$\gamma=1-\frac{F I_e}{L_eP_e}$$

Thus the product $L_e.P_e$ must be high. $P_e$ is a function of the emitter zone doping. Thus, any method of manufacture giving a high p-type impurity concentration in the emitter zone is desirable. In one method of manufacture, a diffusion process may be used which gives a high surface concentration of the significant impurity. This method is acceptable but suffers from the disadvantage that the highest impurity concentration is at the surface and hence is remote from the p-n junction. Thus the diffusion length $L_e$ becomes even more critical than in the case of a uniformly doped emitter.

A second method is to alloy using a material which has a high effective segregation coefficient at the alloying temperature. Since the segregation coefficient cannot increase with decreasing temperature, the upper limit of the effective segregation coefficient must be that of the quasi-equilibrium segregation coefficient normally quoted in the literature and it is thus desirable that this should be high. Boron has a high segregation coefficient and is a desirable addition for silicon and germanium.

It has been found that Al/B/Si alloys can be used for giving a high emitter doping for silicon transistors, but the factor of increase over the values obtained for aluminum alone is only about 4. This value is smaller than is expected from theory and it would seem that a property of aluminum is inhibiting the intake of the boron and is having the effect of lowering its effective concentration in solution (possibly by the formation of a B/Al compound or by some similar mechanism). Using Al/B/Si alloy as a material for alloying to a silicon body, it is possible to achieve a mean boron impurity concentration of about $2\times10^{19}$ atoms/cc.

Boron has not hitherto, in general, been used for doping germanium bodies since it has proved difficult to introduce boron into a germanium recrystallized zone. For germanium it is possible to achieve a mean indium significant impurity concentration by alloying of about $5\times10^{19}$ atoms/cc. and with the addition of gallium or aluminum to the indium, it is possible to improve this figure to about $5\times10^{20}$ atoms/cc.

It has now been found that copper provides a vehicle for assisting the dissolving of boron.

According to a first aspect of the present invention, a method of manufacturing a semi-conductor device comprises the step of alloying to a semi-conductor body a material comprising or consisting of copper and boron. The mean boron content of the recrystallized zone may be at least $3\times10^{19}$ atoms/cc.

The material may be alloyed in a plurality of steps. Thus the copper may be alloyed as a first step and boron added to the melt so produced as a second step.

In the process known as "alloying," a liquid zone consisting of material to be alloyed to the body and some material dissolved thereby from the body, is produced at the surface of the body. On cooling, first a recrystallized zone is produced consisting mainly of the material dissolved from the body, having a small doping content of the material to be alloyed and forming an extension of the crystal lattice of the undissolved part of the body, and thereafter the remainder of the liquid forms a resolidified zone consisting mainly of the material to be alloyed and having a small content of the material dissolved from the body. The alloying process may result in the production of a p-n junction or in the production of an ohmic connection to the body.

The method according to the present invention may be used with bodies of silicon, germanium and silicon/germanium and may also be used with other bodies of a binary nature or bodies of a ternary nature.

The present invention thus provides an alternative method of manufacturing semi-conductor devices which makes it possible to obtain a high concentration of boron in the recrystallized zone produced in the alloying process.

As explained above, the device may be a transistor and the recrystallized zone may with advantage constitute the emitter zone since it is known that the efficiency of an emitter depends on the concentration of significant impurity within the emitter region.

The present invention may also be used in the manufacture of crystal diodes or of devices other than transistors having p-n diode sections, since a high significant impurity concentration in a recrystallized zone at one side of a p-n junction may give an improved forward characteristic. Further, in making an ohmic contact, a high significant impurity concentration provides a low resistivity recrystallized zone.

In general, it is desirable to use a large amount of boron relative to copper but there is a limitation in respect of the satisfactory nature of the alloying. For silicon, 0.3% to 2%, or even to 5%, is a useful range by weight of boron in the copper/boron. In a particular case, using copper and boron in the ratios by weight of 98:2 when alloying to a silicon body, it is found possible to obtain a mean boron significant impurity concentration in the recrystallized zone produced by alloying of about $3\times10^{20}$ atoms per cc.

Copper/boron alloys can readily be made having a boron content as high as about 2% by weight which may be rolled and worked in a manner not very different from that in which pure copper may be rolled and worked. Such an alloy will alloy with n-type silicon at temperatures of 805° C. and over to form a p-n junction, and measurements have shown that the mean impurity content of the alloyed region can be about $2\times10^{20}$ to $3\times10^{20}$ atoms/cc. Lower ranges of mean boron content in the copper, however, would still be useful and values greater than $5\times10^{19}$ atoms/cc. would be appreciably better than is obtainable with Al/B/Si ($3\times10^{19}$).

The material may comprise an additional component whereby any tendency to cracking is reduced, for example, by the provision of a softer resolidified zone after alloying, and/or the temperature of alloying is reduced. The additional component X may be added before alloying so that a Cu/B/X material is alloyed or may be added to the melt containing copper/boron during alloying. Examples of suitable additional components X are Ag, Pb, In, Sn, Au and Ni—Pb. The component X may also be constituted by the same semi-conductive material as that of the semi-conductor body (not necessarily doped in the same manner as the material of the body), for example if the body is of silicon, the component X may be silicon.

Where there is a tendency for cracking to occur on cooling and this tendency is particularly marked if the semi-conductor body is of silicon, it is thought that the cracking is due to the hardness of the copper/boron/semiconductor material phase which solidifies at the eutectic point and forms the resolidified metallic contact to the recrystallized zone.

A further way of reducing the tendency to cracking is to remove the part of the melt which would otherwise form the resolidified zone after sufficient recrystallized material has grown, by mechanical or chemical means, and to make contact to the recrystallized zone, if desired, by any suitable conventional technique.

An example of the reduction in temperature of alloying in respect of the use of tin as the added component is that copper/boron (2% of boron by weight), alloys to silicon when heated to a temperature of about 810° C. whereas copper/boron/tin (2% of boron by weight and 10% of tin by weight) alloys to silicon at 780° C. It is mentioned that at the temperatures at which alloying takes place, the copper/boron and the copper/boron/tin do not melt but that initially diffusion occurs at points of contact between the material to be alloyed and the silicon at the surface of the silicon body. When diffusion occurs, with production of a lower melting-point, a small material amount of liquid is produced at the position of the points of contact and liquefaction then progresses as more of the material to be alloyed and more of the material of the semi-conductor body are dissolved by the melt already produced. It is further mentioned that in the case of tin, a useful lower range of tin content by weight for alloying to silicon is maximally about 10%.

Where an additional component is used, the amount of copper plus boron in the material to be alloyed may be small. In general, for providing a high-efficiency emitter it is necessary for the significant impurity boron to constitute at least 0.3% and up to 2% or even 5% by weight of the material to be alloyed, copper constituting 99.7% if no additional component is used down to a recommended minimum of 5% to 8%.

It is further found that some ranges of content of the additional material are better than others from the aspect of mechanical properties of the resolidified material.

It will be obvious that the additional component will be chosen so that it has little or no effect on the electrical properties of the recrystallized zone.

In any case, it may be stated generally that the use of copper in addition to the significant impurity boron, permits the introduction of a greater concentration of boron into the liquid zone. For silicon, the recrystallized layer concentration is improved and even in the case of germanium, for which at present such materials as aluminum and gallium are used as additives to assist doping, boron can give an improvement since its segregation coefficient is about 17.

According to a second aspect of the present invention, a semi-conductor device comprises a recrystallized zone containing copper and boron.

One example of the method and device according to the present invention will now be given, reference being had to the sole figure of the accompanying drawing, which is a side view of a Cu-B pellet alloyed to a Si wafer:

*Example*

9.8 g. of copper and 0.2 g. of boron are sealed in an evacuated silica crucible, heated by radio-frequency heating at 1,200° C. for ten minutes and thereafter quenched by immersing the crucible in water.

The 10 g. copper/boron ingot so produced and 1 g. of tin are sealed in an evacuated silica crucible, heated by radio-frequency heating at 1,100° C. for ten minutes and thereafter quenched by immersing the crucible in water.

The tin/copper/boron ingot so produced is rolled down to a thickness of about 100$\mu$ and pellets of circular cross-section and 1 mm. in diameter are punched from the rolled sheet.

One of the pellets is placed on an n-type silicon disc, beneath a tantalum disc of cross-section 1 mm. in diameter and a weight of iron or silica of about ½ g., and the pellet is alloyed to the disc to provide a p-type emitter zone by heating the whole at 780° C. for 5 mins. in an atmosphere of hydrogen. The mean boron content of the emitter zone is about $3\times10^{20}$ atoms per cc. The end product is shown in the drawing, which illustrates the Cu-B pellet alloyed on the top surface of the Si wafer.

Summing up, it is possible to achieve doping, especially important in emitter doping, to higher levels than hitherto possible in silicon, and in relation to germanium and other semi-conductor materials a useful alternative method of doping is made available by the present invention. Referring to the particular discussion given above concerning the design of power transistors, it will be seen that $P_e$ is increased. The term $L_e$ may be decreased but an overall gain in the product $L_eP_e$ is obtainable and this is surprising in view of the use of copper.

Measurements have shown that the factor $\alpha'$ may remain substantially constant to about 800 ma. compared with 300 to 500 ma. for a typical "Mullard" (registered trademark) OC 204 transistor device.

The example given above concerns the alloying of a pellet of Cu/B/Sn. As an alternative the Cu/B produced in the manner described in the first step of the example may be alloyed. Further, another material or other materials for reducing the tendency to cracking may be made into an ingot with the Cu/B in the manner described in the second step of the example.

What is claimed is:

1. A semiconductor device comprising a semiconductive crystalline body selected from the group consisting of silicon and germanium, a metal alloy mass fused and alloyed at a surface portion of said body forming a recrystallized zone containing at least copper and boron, said recrystallized zone forming a p-n rectifying junction when said surface portion is of n-type conductivity and forming a $p^+$-p junction when said surface portion is of p-type conductivity, said alloy mass containing from about 0.3% to 5% by weight of boron, from about 5% to 99.7% by weight of copper, and any remainder selected from the group consisting of silver, lead, indium, tin, gold, nickel-lead, and the material of said semiconductive body, the mean boron content of the said recrystallized zone being at least $5\times10^{19}$ atoms per cubic centimeter.

2. A device as set forth in claim 1 wherein the alloy contains 0.3% to 2% by weight of the boron, and the remainder copper, and the body is of silicon.

3. A method of making a semiconductor device, comprising forming an alloy mass consisting essentially of at least about 0.3% by weight of boron and copper, providing a semiconductive crystalline body, fusing and alloying at a surface portion of said body at least a portion of said alloy mass to form therein a recrystallized zone containing at least copper and boron, said recrystallized zone forming a p-n rectifying junction when said surface portion is of n-type conductivity and forming a $p^+$-p junction when said surface portion is of p-type conductivity, the mean boron content of the said recrystallized zone being $5\times10^{19}$ atoms per cubic centimeter.

4. A method of making a semiconductor device, comprising forming an alloy mass by melting together about 0.3% to 5% by weight of boron, from about 5% to 99.7% by weight of copper, and any remainder selected from the group consisting of silver, lead, indium, tin, gold, and nickel-lead, providing a semiconductive crystalline body selected from the group consisting of silicon and germanium, fusing and alloying at a surface portion of said body at least a portion of said alloy mass to form therein a recrystallized zone containing at least copper and boron, said recrystallized zone forming a p-n rectifying junction when said surface portion is of n-type conductivity and forming a $p^+$-p junction when said surface portion is of p-type conductivity, the mean boron content of the said recrystallized zone being at least $5\times10^{19}$ atoms per cubic centimeter.

5. A method as set forth in claim 4 wherein the seimconductor is silicon, and the alloy mass is of copper and boron in a ratio by weight of about 98:2.

References Cited by the Examiner

UNITED STATES PATENTS

| | | | |
|---|---|---|---|
| 2,781,481 | 2/57 | Armstrong | 148—1.5 X |
| 2,837,448 | 6/58 | Thrumond | 148—1.5 |
| 2,964,397 | 12/60 | Cooper | 75—153 |
| 2,986,481 | 5/61 | Gudmundsen | 148—185 |
| 3,009,840 | 11/61 | Emeis | 148—185 |

OTHER REFERENCES

Hansen: Constitution of Binary Alloys, 2nd Edition, 1958, McGraw-Hill Book Co., Inc., pages 248–249.

DAVID L. RECK, *Primary Examiner.*

HYLAND BIZOT, *Examiner.*